United States Patent [19]

Morcom

[11] 4,255,229
[45] Mar. 10, 1981

[54] METHOD OF REWORKING PROMS

[75] Inventor: William R. Morcom, Melbourne Beach, Fla.

[73] Assignee: Harris Corporation, Melbourne, Fla.

[21] Appl. No.: 66,592

[22] Filed: Aug. 14, 1979

[51] Int. Cl.³ .................. H01L 21/283; H01L 21/302
[52] U.S. Cl. .................... 156/628; 156/656; 156/657; 156/662; 156/664; 156/665; 427/90; 427/93
[58] Field of Search ............... 156/628, 636, 657, 662, 156/663, 656, 664, 665; 427/88, 93, 89, 90

[56] References Cited
U.S. PATENT DOCUMENTS

| | | | |
|---|---|---|---|
| 3,497,407 | 2/1970 | Esch et al. | 156/657 |
| 4,056,413 | 11/1977 | Yoshimura | 156/662 |

OTHER PUBLICATIONS

Spencer, "Smoothing of Irregular . . . Surfaces" IBM Technical Disclosure Bulletin vol. 20 No. 11B 4/78 p. 4842.

*Primary Examiner*—Jerome W. Massie
*Attorney, Agent, or Firm*—Leitner, Palan, Lyman, Martin & Bernstein

[57] ABSTRACT

PROM wafers having fuses on raised oxide are reworked by stripping the fuses and connectors, non-selectively etching the oxide layer to form a substantially planar, oxide surface resulting from the differential etching rate of the heavily phosphorus doped raised oxide surface compared to the remainder of lightly doped oxide, increasing the oxide layer thickness and forming new fuses and connectors on the new oxide.

8 Claims, 6 Drawing Figures

METHOD OF REWORKING PROMS

BACKGROUND OF THE INVENTION

1. The Field of the Invention

The present invention relates generally to integrated circuits having fusible elements and connectors thereon, and more specifically to a method of reworking such integrated circuits.

2. Description of the Prior Art

In an integrated circuit having fuses, specifically PROMS, rework of the wafer could lead to reliability problems. Generally in the past, the wafers have been scrapped instead of reworked because of the potential reliability problems. In the manufacturing process of semiconductor device as illustrated in FIG. 1, the upper surface of a semiconductor wafer 10 is coated with an oxide layer 12 in which openings are formed for impurity deposition and diffusion into the substrate and for contact areas to the substrate. Sometimes phosphorus is specifically diffused into the surface of oxide layer 12 for improving the characteristics and the stability of the semiconductor device as well as diffusion incidently resulting during the fabrication of NPN bipolar devices. This is illustrated as region 14 wherein the concentration decreases with depth from the surface. The formation of the fuses and interconnects proceed by applying a layer 16 of fusible material on the surface which is delineated to produce the specific fusible elements. Next, the surface of the wafer is deglazed with an etchant to assure good contact to the substrate surface by the connector material. However, while the deglaze appears to be non-selective, it is not because the fuses 16 on the surface serve to mask the oxide underneath from the etchant attack. This results in a formation of a raised area 18 of oxide below the fuse 16. The fabrication is completed by applying a layer 20 of connector material and delineation of the same. The resulting structure is illustrated in FIG. 2.

In efforts to rework the wafer would generally include stripping or removing the connectors 20 and the fuses 16. This would result in a non-planar oxide surface as illustrated in FIG. 3 wherein the heavily doped phosphorus region 18 is raised compared to the remaining low phosphorus region of the remainder of oxide layer 12. It has been found that fuses reprocessed on the structure illustrated in FIG. 3 are virtually impossible to realign perfectly and consequently result in the structure of FIG. 4 with a new fuse 22 is misaligned relative to the raised oxide region 18. Fuses 22 formed on the stepped region 18 are undesirable since they pose the potential problem of only partially programming.

Thus, there exists a need to provide an inexpensive process for reprocessing the oxide layer of semiconductor wafers to allow reworking of fuses and connectors thereon to produce a high reliability product.

SUMMARY OF THE INVENTION

The present invention provides an effective process for reworking semiconductor wafers having fuses and connectors thereon by forming a planar surface thereon by using the differential etching rate of the raised portion of the oxide compared to the remainder of the oxide surface. The fuses and connectors are removed or stripped from the surface of the oxide. The oxide is then nonselectively etched in an etchant for a sufficient time to form a substantially planar oxide surface as a result of the differential etching rate of the highly phosphorus doped raised oxide portion existing where the fuse formerly existed compared to the low phosphorus doped region of the remainder of the oxide layer. Using a 40 to 1 deionized water to hydroflouric acid etchant, a minimum of 30 seconds and preferably up to 120 second etch time, is sufficient. Additional oxide is then formed to increase the thickness of the oxide layer followed by the formation of fuses and connectors on the oxide layer.

OBJECTS OF THE INVENTION

The object of the present invention is to provide a rework process for semiconductor wafers having fuses and connectors formed thereon.

Another object is to provide an inexpensive rework process for an oxide layer taking advantage of the differential etching rates of the oxide layer.

A further object of the invention is to provide a rework process for nichrome fuses and aluminum connectors which increases the reliability of the reworked product.

Other objects, advantages and novel features of the present invention will become apparent from the following detailed description of the invention when considered in conjunction with the accompanying drawings.

DESCRIPTION OF THE PREFERRED EMBODIMENTS

Figure 3:
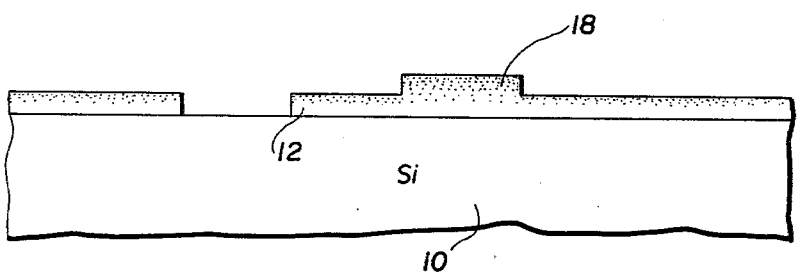
FIGS. 3 and 4 are cross-sectional views of an integrated circuit illustrating ineffective reworking process.
Figure 4:
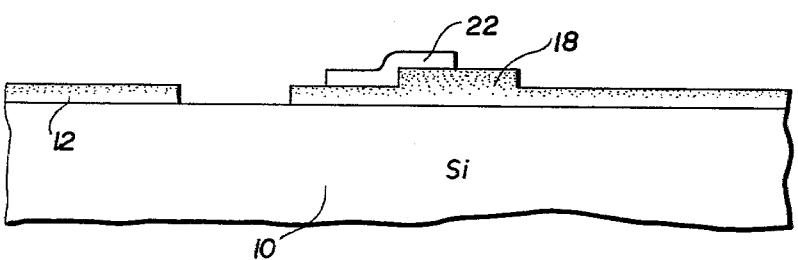
Figure 5:
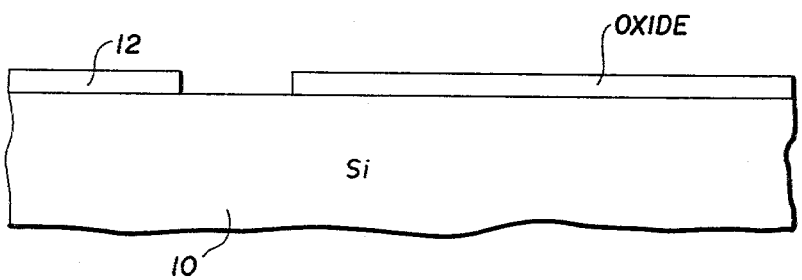
FIGS. 5 and 6 are cross-sectional views of an integrated circuit illustrating the process embodying the principles of the present invention at differing stages of fabrication.

The process of the present invention begins with the removal or stripping of the fuses 16 and the connectors 20 from the surface of the oxide resulting in the structure of FIG. 3 wherein a substrate 10 has an oxide layer 12 thereon including raised oxide portions 18 which are the imprints of the fuses. The regions 18 are heavily doped with a phosphorus compared to the remainder of the surface of 12 which is substantially lightly doped to a very shallow depth. With a silicon substrate for example, the oxide layer is silicon oxide. The structure of FIG. 3 is then subjected to an etchant, for example, 40 to 1 deionized water to hydroflouric acid for a sufficient time to form a substantially planar oxide layer as illustrated in FIG. 5. Since the raised oxide portions 18 are heavily doped with phosphorus compared to the remainder of the oxide layer 12, the raised portions etch very rapidly compared to the remainder of the oxide surface. After approximately 30 seconds, the rate of etching of the raised portion slows considerably and within approximately 120 seconds, a substantially planar surface is formed. In a typical circuit, the raised portion 18 would have a thickness of approximately 1800 angstroms and a phosphorus impurity concentration of approximately $10^{20}$ carriers per cubic centimeter. After the 120 seconds, the resulting thickness of the oxide as illustrated in FIG. 5 would be approximately 4000 angstroms.

Figure 1:
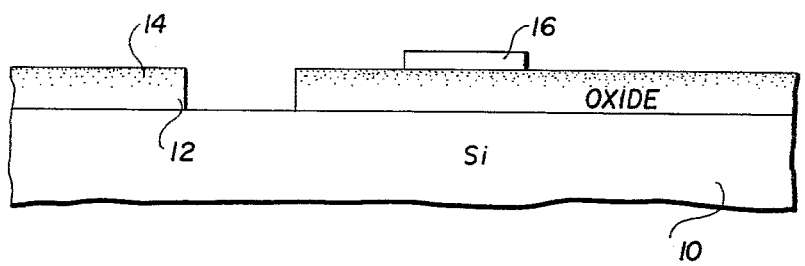
FIGS. 1 and 2 are cross-sectional views of an integrated circuit illustrating the formation of fuses and connectors using processes of the prior art.
Figure 2:
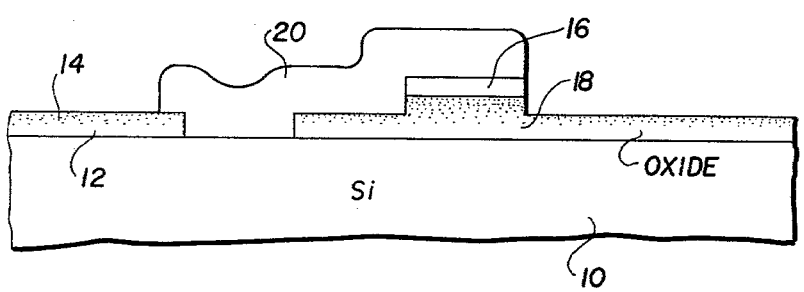
Figure 6:
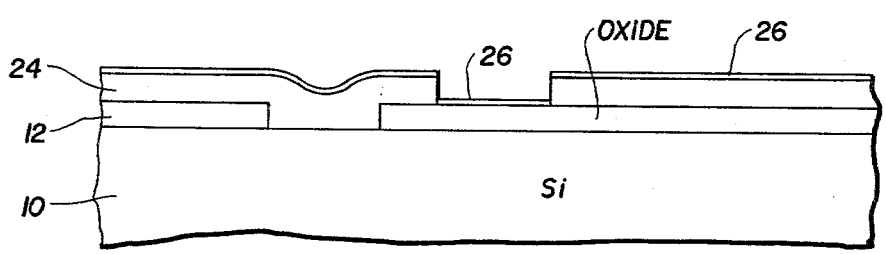

Once the substantially planar oxide surface is formed, additional oxide is formed on layer 12 to build the field oxide back up to an acceptable level which will properly thermally insulate the fuse and the substrate as illustrated in FIG. 5. For example, 1500 angstroms may be added by the deposition of silox. By providing a substantially planar oxide surface, any misalignment of the new mask relative to the original mask has no effect on the subsequently formed fuses. The process is then continued using techniques of the prior art to form the fuses and connectors on the integrated circuit. This process generally includes the formation of a photoresist material on the oxide surface 12 which is delineated to form a mask for aperture openings to the substrate 10. These apertures are formed by, for example, chemical or sputter etching. Next, a photoresist material 24 is applied to the surface of the oxide and exposed to delineate the fuses followed by a thin layer of fusible material 26 applied by evaporation as illustrated in FIG. 6. Fusible material 26 may be for example, nichrome having a thickness of less than 200 angstroms. The photoresist and the overlapping fusible materials are then removed to form the fuse 16 as illustrated in FIG. 1. This is followed by a deglazing of the contact apertures before the formation of the connectors. The deglazing may include the use of the 40 to 1 deionized water to hydrofluoric acid etchant. Next a layer of conductive material, for example, aluminum or silicon doped aluminum having a thickness of 11,000 a angstroms is formed. Photoresistant material is then formed over the aluminum and exposed and delineated to form the connector patterns. The resulting structure is that illustrated in FIG. 2.

It should be noted that the thicknesses of the elements in the drawings are purposely exaggerated to illustrate the problem of prior art rework process and thus are not be taken as proportioned. Examples of element thicknesses are described above.

Aluminum as the connector and nichrome as the fusible material are examples of the many materials which may be used. Similarly, the process has been described as using a silicon substrate with an oxide layer thereon whose surface has been treated with phosphorus impurities as examples. The present invention may include other substrates having insulative layers thereon with even other impurities. The rework process of the present invention may be used to rework any wafer wherein the insulative layer upon stripping of the metals have raised portions with a higher concentration of impurities than the remainder of the wafer. The etchant is selected to take advantage of differential etching rates of an insulating layer having different impurity concentration.

From the preceeding description of the preferred embodiments, it is evident that the objects of the invention are attained in that a rework process is described which produces a highly reliable reworked product. Although the invention has been described and illustrated in detail, it is to be clearly understood that the same is by way of illustration and example only and is not to be taken by way of limitation. The spirit and the scope of this invention is to be limited only by the terms of the appended claims.

What is claimed:

1. A method of reworking a semiconductor substrate having an oxide layer thereon, connectors on said oxide layer and fuses on raised portion of said oxide layer, said raised portions of said oxide layer being heavily doped with impurities compared to the remainder of said oxide layer comprising:
   stripping said connectors and said fuses from said oxide layer; and
   etching said exposed oxide layer for a time sufficient to form a substantially planar oxide surface as a result of the differential etching rate of said raised and remainder of the oxide layer.

2. The method of claim 1 wherein said etching is performed using a hydrofluoric based etchant.

3. The method of claim 2 wherein said etchant is 40 to 1 deionized water to hydrofluoric acid and said time is a minimum of thirty seconds.

4. The method of claim 3 wherein said time is 120 seconds.

5. The method of claim 1 including:
   forming additional oxide to increase the thickness of said oxide layer;
   forming fuses on said oxide layer; and
   forming connectors on said oxide layer.

6. A method of reworking a silicon substrate having an oxide layer thereon, aluminum connectors on said oxide layer, nichrome fuses on raised portions of said oxide layer, said raised portions of said oxide layer being heavily doped with phosphorus compared to the remainder of said oxide layer comprising:
   removing said connectors and said fuses from said oxide layer;
   etching said exposed oxide layer for a time sufficient to form a substantially planar oxide surface as a result of the differential etching rates of the raised portion and the remainder of the oxide layer;
   forming additional oxide on said oxide layer to increase its thickness; and
   forming fuses and connectors on said oxide layer.

7. The method of claim 6 wherein said etching is performed using a hydrofluoric based etchant.

8. The method of claim 7 wherein said time is approximately 120 seconds.

* * * * *

UNITED STATES PATENT AND TRADEMARK OFFICE
CERTIFICATE OF CORRECTION

PATENT NO. : 4,255,229
DATED : March 10, 1981
INVENTOR(S) : William R. Morcom

It is certified that error appears in the above—identified patent and that said Letters Patent is hereby corrected as shown below:

Column 1, line 40, delete "In".

Column 1, line 40, delete "efforts" and insert therefor -- Efforts --.

Column 1, line 49, delete "is".

Column 2, line 5, insert -- a -- before "120".

Column 2, line 34, insert -- an -- before "ineffective".

Column 3, line 29, delete "a".

Column 3, line 35, delete "process" and insert therefor -- processes --.

Column 3, line 36, delete "proportioned" and insert therefor -- proportional --.

Column 3, line 48, delete "have" and insert therefor -- has --.

UNITED STATES PATENT AND TRADEMARK OFFICE
CERTIFICATE OF CORRECTION

PATENT NO. : 4,255,229

DATED : March 10, 1981

INVENTOR(S) : William R. Morcom

It is certified that error appears in the above—identified patent and that said Letters Patent is hereby corrected as shown below:

Column 3, line 52, add -- s -- at the end of the word.

Column 3, line 53, delete "preceeding" and insert therefor -- preceding --.

Column 4, line 7, delete "is" and insert -- are --.

Signed and Sealed this

Second Day of June 1981

[SEAL]

Attest:

RENE D. TEGTMEYER

*Attesting Officer*  *Acting Commissioner of Patents and Trademarks*